(12) United States Patent
Lee

(10) Patent No.: US 9,323,411 B2
(45) Date of Patent: Apr. 26, 2016

(54) DISPLAY DEVICE INCLUDING TOUCH SCREEN PANEL AND METHOD OF MANUFACTURING THE SAME

(71) Applicant: Samsung Display Co., Ltd., Yongin, Gyeonggi-do (KR)

(72) Inventor: Youn-Bum Lee, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/534,964

(22) Filed: Nov. 6, 2014

(65) Prior Publication Data

US 2015/0177893 A1  Jun. 25, 2015

(30) Foreign Application Priority Data

Dec. 23, 2013  (KR) .......................... 10-2013-0160946

(51) Int. Cl.
*G06F 3/047* (2006.01)
*G05B 19/418* (2006.01)
*H01L 27/32* (2006.01)

(52) U.S. Cl.
CPC ............. *G06F 3/047* (2013.01); *G05B 19/4188* (2013.01); *G05B 2219/40066* (2013.01); *H01L 27/323* (2013.01); *Y02P 90/02* (2015.11)

(58) Field of Classification Search
CPC ................ G06F 3/047; G05B 19/4188; G05B 2219/40066; H01L 27/323
See application file for complete search history.

(56) References Cited

U.S. PATENT DOCUMENTS

| 2004/0041796 | A1  | 3/2004  | Lee |
| 2010/0085320 | A1* | 4/2010  | Kuwajima .......... G02F 1/13338 345/173 |
| 2010/0265198 | A1  | 10/2010 | Kondoh et al. |
| 2013/0306459 | A1* | 11/2013 | Anno ...................... G06F 3/044 200/600 |
| 2014/0375910 | A1* | 12/2014 | Tada ...................... G06F 3/044 349/12 |

FOREIGN PATENT DOCUMENTS

| KR | 10-2004-0020288 A | 3/2004 |
| KR | 10-2010-0116136 A | 10/2010 |
| KR | 10-2012-0039854 A | 4/2012 |
| KR | 10-1204906 B1     | 11/2012 |

* cited by examiner

*Primary Examiner* — Premal Patel
(74) *Attorney, Agent, or Firm* — Knobbe Martens Olson & Bear LLP

(57) ABSTRACT

A display device including a touch screen panel and method of manufacturing the same are disclosed. In one aspect, the display device includes a first substrate including a display region and a peripheral region, a light-emitting structure formed over the first substrate, and a second substrate formed over the light-emitting structure. The display device also includes a touch screen panel formed over the second substrate and a touch screen panel-flexible printed circuit (TSP-FPC) board at least partially overlapping the peripheral region, wherein the TSP-FPC board is electrically connected to the touch screen panel. The display device further includes a protective member substantially covering the display region and the peripheral region. A top structure is interposed between the TSP-FPC board and the protective member in the peripheral region and a bottom structure interposed between the TSP-FPC board and the first substrate in the peripheral region.

20 Claims, 10 Drawing Sheets

DISPLAY DEVICE INCLUDING TOUCH SCREEN PANEL AND METHOD OF MANUFACTURING THE SAME

CROSS-REFERENCE TO RELATED APPLICATIONS

This application claims priority under 35 U.S.C. §119 to Korean patent Application No. 10-2013-0160946 filed on Dec. 23, 2013, the disclosure of which is hereby incorporated by reference herein in its entirety.

BACKGROUND

1. Field

The described technology generally relates to a display device and a method of manufacturing the same.

2. Description of the Related Technology

Display devices having a touch screen panel are widely used. The touch screen panel of the standard display device is formed on a polarizer. As the manufacturing technology for display devices has advanced, touch screen panels can be formed on the top substrate (e.g., an encapsulation substrate or encapsulation unit) of the display device. To minimize the size or reduce the thickness of a display device having a touch screen panel, the thickness of a bottom substrate of the display device can be reduced.

SUMMARY OF CERTAIN INVENTIVE ASPECTS

One inventive aspect is a display device having buffer structures on a touch screen panel-flexible printed circuit and a method of manufacturing the same.

Another aspect is a display device including top and bottom structures on a touch screen panel-flexible printed circuit.

Another aspect is a method of manufacturing a display device including top and bottom structures on a touch screen panel-flexible printed circuit.

Another aspect is a display device including a first substrate, a light-emitting structure, a second substrate, a touch screen panel, a touch screen panel-flexible printed circuit (TSP-FPC), a polarizer, a resin layer, a protecting member, a top structure, and a bottom structure. The first substrate includes a display region and a peripheral region. The light-emitting structure is formed on the first substrate. The second substrate is formed on the light-emitting structure and the second substrate is opposed to the first substrate. The touch screen panel is formed on the second substrate. The TSP-FPC is formed in the peripheral region and the TSP-FPC is electrically connected to the touch screen panel. The polarizer is formed in the display region of the touch screen panel. The resin layer is formed on the polarizer. The protecting member is formed on the resin layer and the protecting member covers the display region and the peripheral region. The top structure is formed between the TSP-FPC and the protecting member in the peripheral region. The bottom structure is formed between the TSP-FPC and the first substrate in the peripheral region.

At least one of the top structure and the bottom structure may be a buffer member, a supporting member, or a spacer.

The top structure may maintain a distance between the TSP-FPC and the protecting member.

The top structure may be formed on an upper surface of the TSP-FPC and may contact a lower surface of the protecting member in the peripheral region.

The top structure may be formed on an upper surface of the TSP-FPC and may be spaced apart from a lower surface of the protecting member in the peripheral region.

The bottom structure may maintain a distance between the TSP-FPC and the first substrate.

The bottom structure may be formed on a lower surface of the TSP-FPC and may contact an upper surface of the first substrate in the peripheral region.

The bottom structure may be formed on a lower surface of the TSP-FPC and may be spaced apart from an upper surface of the first substrate in the peripheral region.

At least one of the top structure and the bottom structure may include a stacked structure including a plurality of layers.

Each of the layers may be a polyethylene terephthalate (PET) layer, a polyimide (PI) layer, or a silicon rubber layer.

The stacked structure may further include an adhesive tape between the layers.

Another aspect is a method of manufacturing a display device. In the method, a first substrate including a display region and a peripheral region may be provided. A light-emitting structure may be formed on the first substrate. A second substrate may be formed on the light-emitting structure and the second substrate may be opposed to the first substrate. A touch screen panel may be formed on the second substrate. A touch screen panel-flexible printed circuit (TSP-FPC) may be provided. A top structure may be formed on an upper surface of the TSP-FPC. A bottom structure may be formed on a lower surface of the TSP-FPC. The TSP-FPC on which the top and bottom structures are formed may be attached to the peripheral region. The TSP-FPC may be electrically connected to the touch screen panel. A polarizer may be formed on the touch screen panel in the display region. A resin layer may be formed on the polarizer. A protecting member may be formed on the resin layer, the protecting member covering the display region and the peripheral region.

At least one of the top structure and the bottom structure may be a buffer member, a supporting member, or a spacer.

The top structure may maintain a distance between the TSP-FPC and the protecting member.

The bottom structure may maintain a distance between the TSP-FPC and the first substrate.

At least one of the top structure and the bottom structure may include a stacked structure including a plurality of layers, and each of the layers may be a polyethylene terephthalate layer, a polyimide layer, or a silicon rubber layer.

The stacked structure may further include an adhesive tape between the layers.

Another aspect is a method of manufacturing a display device. In the method, a first substrate including a display region and a peripheral region may be provided. A light-emitting structure may be formed on the first substrate. A second substrate may be formed on the light-emitting structure and the second substrate may be opposed to the first substrate. A touch screen panel may be formed on the second substrate. A touch screen panel-flexible printed circuit (TSP-FPC) may be provided. A bottom structure may be formed on a lower surface of the TSP-FPC. The TSP-FPC on which the bottom structure is formed may be attached to the peripheral region. The TSP-FPC may be electrically connected to the touch screen panel. A protecting member covering the display region and the peripheral region may be provided. A resin layer may be formed on a lower surface of the protecting member in the display region. A polarizer may be formed on lower surface of the resin layer. A top structure may be formed on a lower surface of the protecting member at the peripheral region. The protecting member on which the top structure, the resin layer, and the polarizer are formed may be attached to the touch screen panel.

The top structure may maintain a distance between the TSP-FPC and the protecting member.

The bottom structure may maintain a distance between the TSP-FPC and the first substrate.

Another aspect is a display device including a first substrate including a display region and a peripheral region, a light-emitting structure formed over the first substrate, a second substrate formed over the light-emitting structure, a touch screen panel formed over the second substrate, a touch screen panel-flexible printed circuit (TSP-FPC) board at least partially overlapping the peripheral region, wherein the TSP-FPC board is electrically connected to the touch screen panel, a polarizer formed over the touch screen panel in the display region, a resin layer formed over the polarizer, a protective member formed over the resin layer, wherein the protective member substantially covers the display region and the peripheral region, a top structure interposed between the TSP-FPC board and the protective member in the peripheral region, and a bottom structure interposed between the TSP-FPC board and the first substrate in the peripheral region.

Each of the top structure and the bottom structure includes a buffer member, a supporting member, or a spacer. The top structure is configured to maintain the TSP-FPC board at a predetermined distance from the protective member. The top structure is formed on an upper surface of the TSP-FPC board and contacts a lower surface of the protective member. The top structure is formed on an upper surface of the TSP-FPC board and is spaced apart from a lower surface of the protective member. The bottom structure is configured to maintain the TSP-FPC board at a predetermined distance from the first substrate. The bottom structure is formed on a lower surface of the TSP-FPC board and contacts an upper surface of the first substrate. The bottom structure is formed on a lower surface of the TSP-FPC board and is spaced apart from an upper surface of the first substrate. At least one of the top structure and the bottom structure comprises a plurality of layers. Each of the layers is a polyethylene terephthalate (PET) layer, a polyimide (PI) layer, or a silicon rubber layer. The at least one of the top structure and the bottom structure further includes an adhesive tape interposed between the layers.

Another aspect is a method of manufacturing a display device including providing a first substrate including a display region and a peripheral region, forming a light-emitting structure over the first substrate, forming a second substrate over the light-emitting structure, forming a touch screen panel over the second substrate, providing a touch screen panel-flexible printed circuit (TSP-FPC) board, forming a top structure on an upper surface of the TSP-FPC board, forming a bottom structure on a lower surface of the TSP-FPC board, attaching the TSP-FPC board to the first substrate such that the top and bottom structures are located in the peripheral region, electrically connecting the TSP-FPC board to the touch screen panel, forming a polarizer over the touch screen panel in the display region, forming a resin layer over the polarizer, and forming a protective member over the resin layer, wherein the protective member substantially covers the display region and the peripheral region.

Each of the top structure and bottom structure comprises a buffer member, a supporting member, or a spacer. The top structure is configured to maintain the TSP-FPC board at a predetermined distance from the protective member. The bottom structure is configured to maintain the TSP-FPC board at a predetermined distance the first substrate. The forming of at least one of the top structure and the bottom structure comprises forming a plurality of layers and each of the layers is a polyethylene terephthalate layer, a polyimide layer, or a silicon rubber layer. The forming of the layers further includes forming an adhesive material between the layers.

Another aspect is a method of manufacturing a display device including providing a first substrate including a display region and a peripheral region, forming a light-emitting structure over the first substrate, forming a second substrate over the light-emitting structure, forming a touch screen panel over the second substrate, providing a touch screen panel-flexible printed circuit (TSP-FPC) board, forming a bottom structure on a lower surface of the TSP-FPC board, attaching the TSP-FPC board to the first substrate such that the bottom structure is located in the peripheral region, electrically connecting the TSP-FPC board to the touch screen panel, providing a protective member, forming a resin layer under the protective member, forming a polarizer under the resin layer, forming a top structure on a lower surface of the protective member in the peripheral region, and attaching the protective member to the touch screen panel.

The top structure is configured to maintain the TSP-FPC board at a predetermined distance from the protective member. The bottom structure is configured to maintain the TSP-FPC board at a predetermined distance from the first substrate.

Another aspect is a display device including a first substrate including a display area and a peripheral area, a light-emitting structure formed over the first substrate in the display area, a touch screen panel formed over the light-emitting structure, a second substrate formed over the touch screen panel and substantially covering the display area and the peripheral area, a touch screen panel-flexible printed circuit (TSP-FPC) board electrically connected to the touch screen panel, a first spacer formed in the peripheral area and interposed between the TSP-FPC board and the first substrate, and a second spacer formed in the peripheral area and interposed between the TSP-FPC board and the second substrate.

The first spacer is configured to maintain a first distance between the TSP-FPC board and the first substrate and the second spacer is configured to maintain a second distance between the TSP-FPC board and the second substrate. The second distance is greater than the first distance. The second spacer is formed on an upper surface of the TSP-FPC board and is spaced apart from a lower surface of the second substrate. The first spacer is formed on a lower surface of the TSP-FPC board and is spaced apart from an upper surface of the first substrate.

According to at least one embodiment, a display device may prevent a bottom substrate having a thin profile from being damaged due to external impacts near a pad area because the display device includes the top and bottom structures on a TSP-FPC.

In addition, according to at least one embodiment, a method of manufacturing a display device may prevent a bottom substrate having a thin profile thickness from being damaged due to external impacts near a pad unit because the display device includes the top and bottom structures. Also, since the bottom substrate has a thin profile, the overall thickness of the display device can be reduced.

DETAILED DESCRIPTION OF CERTAIN INVENTIVE EMBODIMENTS

Figure 1:
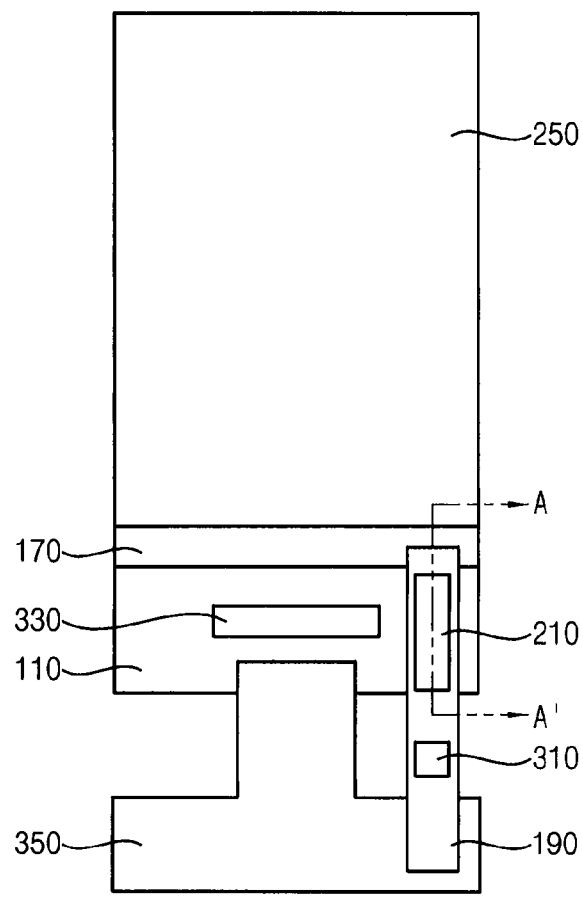
FIG. 1 is a plane view illustrating a display device according to an embodiment.

In reducing the thickness of a display device having a touch screen panel, the thickness of the bottom substrate can be reduced. However, when the thickness of the bottom substrate is reduced, it is more vulnerable to being broken when exposed to external impacts, and is particularly vulnerable at its periphery.

Hereinafter, exemplary embodiments will be described in detail with reference to the accompanying drawings. In the drawings, identical or similar reference numerals represent identical or similar elements. The term "substantially" as used in this disclosure means completely, almost completely, or to any significant degree. As used herein, the term "about" modifies a numerical value to include at least a range that is less or greater than the numeric value by up to 1%, up to 5%, or up to 10%.

Figure 2:
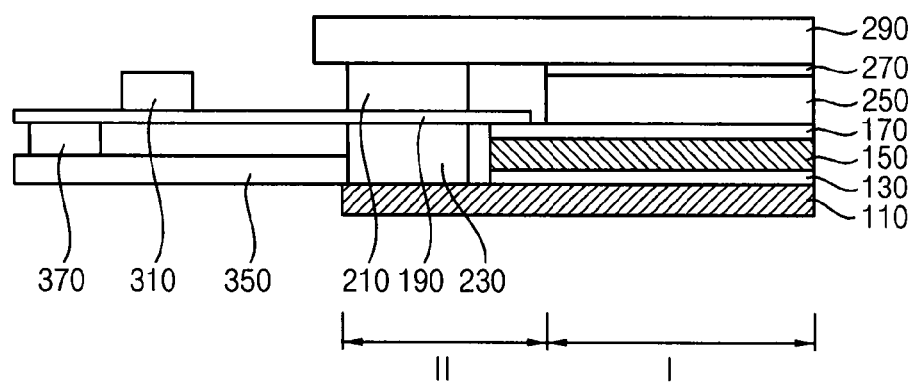
FIG. 2 is a side view illustrating a display device according to an embodiment.

Referring to FIGS. 1 and 2, a display device 100 includes a first substrate 110, a light-emitting structure 130, a second substrate 150, a touch screen panel 170, and a touch screen panel-flexible printed circuit (TSP-FPC) or TSP-FPC board 190. The display device 100 also includes a top structure 210, 220, a bottom structure 230, 240, a polarizer 250, a resin layer 270, and a protecting member or protective member 290. The display device 100 further includes a touch screen panel control IC 310, a driving IC 330, a main panel flexible printed circuit 350, and a flexible printed circuit connector 370.

The first substrate 110 includes a display region I and a peripheral region II adjacent to the display region. The first substrate 110 may include a transparent inorganic material or a flexible plastic. For example, the substrate 110 may include a glass substrate, a quartz substrate, a transparent resin substrate, etc. or a combination thereof. To enable the display device 100 to have a thin profile, the first substrate 110 is formed to be thin. Thus, the strength of the first substrate 110 may be reduced and the first substrate 110 may be more easily broken or damaged in a peripheral portion of the first substrate 110 (e.g., in a pad unit of the display device 100).

The light-emitting structure 130 includes a switching element, an anode electrode, an emission layer, and a cathode electrode. The emission layer generates light. For example, the emission layer is interposed between the cathode electrode and the anode electrode. The emission layer may include a hole injection layer (HIL), a hole transfer layer (HTL), an organic light-emitting layer (EL), an electron transfer layer (ETL), an electron injection layer (EIL), etc. In some embodiments, the organic light-emitting layer includes light-emitting materials capable of generating different colors of light such as red, green, and blue light in accordance with the types of pixels included in the organic light-emitting diode (OLED) display 100. In other embodiments, the organic light-emitting layer generates white light by stacking a plurality of light-emitting materials capable of generating different colors of light such as red, green, and blue light, etc.

The switching element controls the emission of light. In some embodiments, the switching element is an oxide semiconductor device including an active layer containing an oxide semiconductor. The switching element is electrically connected to the anode. The anode and cathode electrodes may include metal, alloy, metallic nitride, conductive metal oxide, a transparent conductive material, etc. or a combination thereof. For example, the anode and cathode electrodes may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. or a combination thereof. These may be used alone or in a combination thereof.

The second substrate 150 is formed on the light-emitting structure 130. Here, the second substrate 150 is opposed to the first substrate 110 and is combined (e.g., encapsulated or sealed by sealant) with the first substrate 110. The second substrate 150 may include transparent inorganic materials or a flexible plastic. For example, the second substrate 150 may include a glass substrate, a quartz substrate, a transparent resin substrate, etc. or a combination thereof. In some embodiments, to increase the flexibility of the display device 100, the second substrate 150 may include at least one an organic layer and at least one an inorganic layer. In other embodiments, the organic and inorganic layers are alternately stacked to increase the flexibility of the display device 100.

The touch screen panel 170 is formed on the second substrate 150. The touch screen panel 170 includes a bottom PET film, touch screen panel electrodes, a top PET film, etc. The bottom PET film and the top PET film may protect the touch screen panel electrodes. For example, the bottom PET film and the top PET film include polyethylene terephthalate PET, polyethylene naphthalate PEN, polypropylene PP, polycarbonate PC, polystyrene PS, polysulfone PSU, polyethyene PE, polyphthalamide PPA, polyethersulfone PES, polyarylate PAR, polycarbonate oxide PCO, modified polyphenylene oxide MPPO, etc. or a combination thereof. In some embodiments, the thickness of the bottom PET is about 80 μm and the thickness of the top PET is about 40 μm to about 60 μm. However, according to other embodiments, the thickness of the bottom PET is less than or greater than about 80 μm and the thickness of the top PET is less than about 40 μm or greater than about 60 μm. The touch screen panel electrodes may have a metal mesh structure. For example, the touch screen panel electrodes may include carbon nano tube CNT, transparent conductive oxide TCO, indium tin oxide ITO, indium gallium zinc oxide IGZO, zinc oxide ZnO, graphene, Ag nanowire AgNW, copper Cu, chrome Cr, etc. or a combination thereof.

The TSP-FPC 190 is formed at the peripheral region II. The TSP-FPC 190 is electrically connected to the touch screen panel 170 via a conductive tape, or the like. The touch screen panel control IC 310, the top structure 210, the bottom structure 230, and the flexible printed circuit connector 370 is formed on the TSP-FPC 190. The touch screen panel control IC 310 controls the driving and sensing of the touch screen panel electrodes having the metal mesh structure. In addition, the TSP-FPC 190 is electrically connected to one region of the main panel flexible printed circuit 350 via the flexible printed circuit connector 370.

The main panel flexible printed circuit 350 is formed on the peripheral region II of the first substrate 110. Here, the peripheral region II of the first substrate 110 corresponds to a pad unit of the display device 100. Also, the driving IC 330 is formed on the pad unit and the driving IC 330 is electrically connected to the main panel flexible printed circuit 350 and the light-emitting structure 130. The driving IC 330 controls the driving of the light-emitting structure 130 having the switching element, the emission layer, the cathode electrode, the anode electrode, etc. Further, in another region of the main panel flexible printed circuit 350, a driving printed circuit board is electrically connected to the main panel flexible printed circuit 350 and the a driving printed circuit board is formed on a lower surface of the first substrate 110 by bending the main panel flexible printed circuit 350. The driving printed circuit board generates a driving control signal which controls the driving IC 330 and a touch screen panel control signal which controls the touch screen panel control IC 310. In some embodiments, the driving printed circuit board generates a voltage signal of constant levels.

The polarizer 250 is formed on the touch screen panel 170 in the display region I. For example, the polarizer 250 may include a resin film such as polyvinyl-alcohol PVA, etc. In some embodiments, the thickness of the polarizer 250 is about 153 μm. The polarizer 250 partially blocks external light received from the environment. In some embodiments, the polarizer 250 includes a λ/4 phase retardation layer and a linearly polarized layer formed on the λ/4 phase retardation layer.

The linearly polarized layer selectively transmits light. The linearly polarized layer transmits light with an amplitude in a single plane. For example, when the pattern of the linearly polarized layer includes horizontal stripes, the linearly polarized layer blocks light having an amplitude in the vertical direction and transmits light having an amplitude in the horizontal direction. When the pattern of the linearly polarized layer includes vertical stripes, the linearly polarized layer blocks light having an amplitude in the horizontal direction and transmits light having an amplitude in the vertical direction.

The λ/4 phase retardation layer converts the phase of transmitted light. The λ/4 phase retardation layer respectively converts the vertically polarized light or the horizontally polarized light into right-circularly polarized light or left-circularly polarized light. In addition, the λ/4 phase retardation layer converts the right-circularly polarized light or the left-circularly polarized light into the vertically polarized light or the horizontally polarized light. For example, when unpolarized light passes through the linearly polarized layer, the linearly polarized layer including the horizontal stripes converts the unpolarized light into horizontally polarized light. When the horizontally polarized light passes through the λ/4 phase retardation layer, the horizontally polarized light is converted to left-circularly polarized light. The left-circularly polarized light can be reflected at the cathode electrode of the light-emitting structure 130 and is thus converted into right-circularly polarized light. When the right-circularly polarized light passes through the λ/4 phase retardation layer again, the light is converted into vertically polarized light. The vertically polarized light is blocked by the linearly polarized layer including the horizontal stripes. Accordingly, the reflected light can be eliminated by the polarizer 250.

The resin layer 270 is formed on the polarizer 250. The protecting member 290 is bonded to the polarizer 250 by the resin layer 270. For example, the resin layer 270 may include a photopolymer resin containing oligomer, urethane acrylate, monomer, photoinitiator, solvent, ketone, etc. or a combination thereof. The photopolymer resin has a high transmittance and is adhesive.

The protecting member 290 is formed on the resin layer 270. The protecting member 290 covers the display region I and the peripheral region II. For example, the protecting member 290 may include a plastic window. The plastic window may include a plastic-based material having transparency of greater than about 95%. However, according to embodiments, the transparency of the plastic window can be less than about 95%.

Referring to FIGS. 3 through 6, the top structure 210 is interposed between the TSP-FPC 190 and the protecting member 290 in the peripheral region II. The bottom structure 230 is interposed between the TSP-FPC 190 and the first substrate 110 in the peripheral region II.

Figure 3:
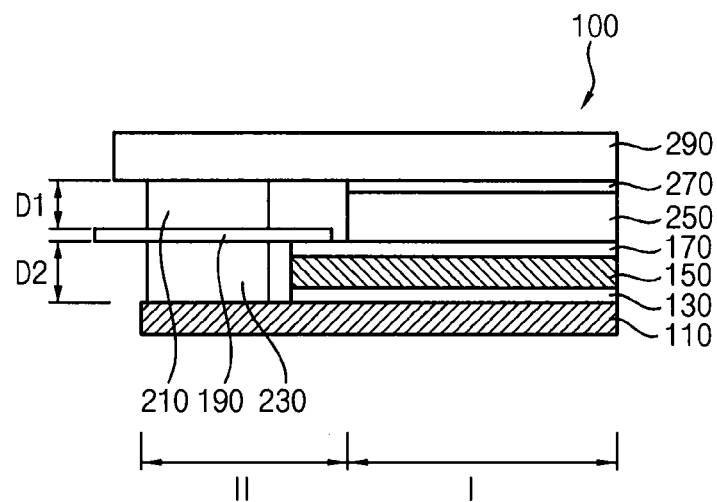
FIG. 3 is a cross-sectional view taken along line A-A' of FIG. 1.

In one example embodiment, as illustrated in FIG. 3, the top structure 210 contacts a lower surface of the protecting member 290 in the peripheral region II. The bottom structure 230 contacts an upper surface of the first substrate 110 in the peripheral region II. The top structure 210 maintains a distance between the TSP-FPC 190 and the protecting member 290. In addition, the bottom structure 230 maintains a distance between the TSP-FPC 190 and the first substrate 110.

In some embodiments, each of the top and bottom structures 210 and 230 include a buffer member, a supporting member, or a spacer. Each of the top and bottom structures 210 and 230 can include a stacked structure including a plurality of layers. Each of the layers may include a polyethylene terephthalate (PET) layer, a polyimide (PI) layer, or a silicon rubber layer or a combination thereof. Here, the stacked structure may further include an adhesive tape layer or adhesive material between the layers. In some embodiments, the adhesive tape layer is formed on an upper surface of the TSP-FPC 190 in the peripheral region II. One or more of the PET layer, the PI layer, and the silicon rubber layer is formed on the adhesive tape layer.

The adhesive tape layer and one or more of the PET layer, the PI layer, and the silicon rubber layer can be sequentially formed on the TSP-FPC 190 based on the distance D1 between the TSP-FPC 190 and the protecting member 290. To substantially prevent the first substrate 110 from being damaged near the pad due to external impacts, the top structure 210 contacts the lower surface of the protecting member 290 in the peripheral region II.

Additionally, the adhesive tape layer is formed on a lower surface of the TSP-FPC 190 in the peripheral region II. One or more of the PET layer, the PI layer, and the silicon rubber layer is formed on a lower surface of the adhesive tape layer. The adhesive tape layer and one or more of the PET layer, the PI layer, and the silicon rubber layer can sequentially formed on the TSP-TPC 190 based on the distance D2 between the TSP-TPC 190 and the first substrate 110. To substantially prevent the first substrate 110 from being damaged near the pad unit due to external impacts, the bottom structure 230 contacts the upper surface of the first substrate 110 in the peripheral region II.

Further, when the top structure 210 contacts the lower surface of the protecting member 290, the top structure 210 functions as a barrier. For example, when the top structure 210 does not contact the lower surface of the protecting member 290, resin, in a liquid state, can freely move from the display region I to the peripheral region II on the protecting member 290 while the resin layer 270 is cured by a laser. The resin moves along the protecting member 290 in the peripheral region II and then the resin can be cured in the peripheral region II of the protecting member 290. Thereafter, a discoloration phenomenon occurs in the peripheral region II of the protecting member 290. Thus, when the top structure 210 contacts the lower surface of the protecting member 290, the top structure 210 substantially blocks the movement of the resin. Accordingly, discoloration of the protecting member 290 can be prevented.

Figure 4:
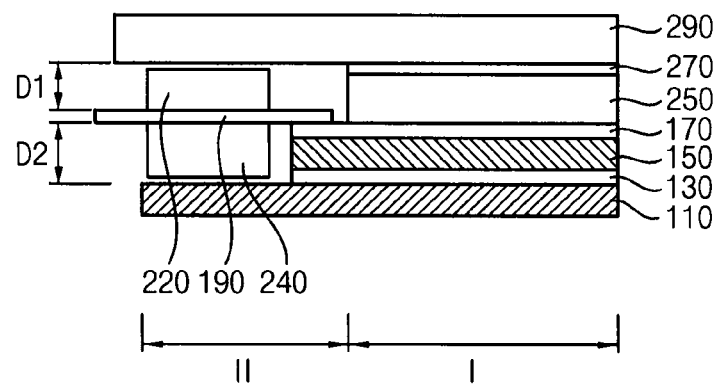
FIG. 4 is a cross-sectional view illustrating a display device according to another embodiment.

In another embodiment, as illustrated in FIG. 4, the top structure 220 is spaced apart from the lower surface of the protecting member 290 in the peripheral region II. In addition, the bottom structure 240 is spaced apart from the upper surface of the first substrate 110 in the peripheral region II. The top structure 220 maintains a distance between the TSP-FPC 190 and the protecting member 290. In addition, the bottom structure 230 maintains a distance between the TSP-FPC 190 and the first substrate 110.

In some embodiments, each of the top and bottom structures 220 and 240 include the buffer member, the supporting member, or the spacer. Each of the top and bottom structures 220 and 240 can include a stacked structure including a plurality of layers. Each of the layers can include the PET layer, the PI layer, or the silicon rubber layer. Here, the stacked structure can further include the adhesive tape layer between the layers. For example, the adhesive tape layer can be formed on an upper surface of the TSP-FPC 190 in the peripheral region II. One or more of the PET layer, the PI layer, and the silicon rubber layer is formed on the adhesive tape layer.

The adhesive tape layer and one or more of the PET layer, the PI layer, and the silicon rubber layer can be sequentially formed on the TSP-FPC 190 based on the distance D1 between the TSP-FPC 190 and the protecting member 290. The top structure 220 is spaced apart from a lower surface of the protecting member 290 in the peripheral region II. To substantially prevent the first substrate 110 from being damaged near the pad unit due to external impacts, the distance between the top structure 220 and the protecting member 290 is relatively small.

Also, the adhesive tape layer is formed on a lower surface of the TSP-FPC 190 in the peripheral region II. One or more of the PET layer, the PI layer, and the silicon rubber layer are formed on a lower surface of the adhesive tape layer. The adhesive tape layer and one or more of the PET layer, the PI layer, and the silicon rubber layer are sequentially formed on the TSP-FPC 190 based on the distance D2 between the TSP-FPC 190 and the first substrate 110. The bottom structure 240 is spaced apart from the upper surface of the first substrate 110 in the peripheral region II. To substantially prevent the first substrate 110 from being damaged near the pad unit due to external impacts, the distance between the bottom structure 240 and the first substrate 110 is relatively small.

Figure 5:
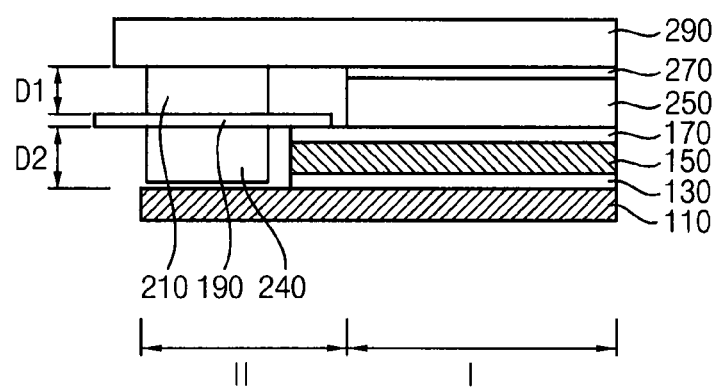
FIG. 5 is a cross-sectional view illustrating a display device according to an embodiment.

In still another embodiment, as illustrated in FIG. 5, the top structure 210 contacts the lower surface of the protecting member 290 in the peripheral region II. In addition, the bottom structure 240 is spaced apart from the upper surface of the first substrate 110 in the peripheral region II. The top structure 210 maintains a distance between the TSP-FPC 190 and the protecting member 290. In addition, the bottom structure 240 maintains a distance between the TSP-FPC 190 and the first substrate 110.

In some embodiments, each of the top and bottom structures 210 and 240 include the buffer member, the supporting member, or the spacer. Each of the top and bottom structures 210 and 240 can include a stacked structure including a plurality of layers. Each of the layers can include the PET layer, the PI layer, or the silicon rubber layer. Here, the stacked structure may further include the adhesive tape layer between the layers. In some embodiments, the adhesive tape layer is formed on an upper surface of the TSP-FPC 190 in the peripheral region II. One or more of the PET layer, the PI layer, and the silicon rubber layer is formed on the adhesive tape layer.

The adhesive tape layer and one or more of the PET layer, the PI layer, and the silicon rubber layer can be sequentially formed on the TSP-FPC 190 based on the distance D1 between the TSP-FPC 190 and the protecting member 290. To substantially prevent the first substrate 110 from being damaged near the pad unit due to external impacts, the top structure 210 contacts the lower surface of the protecting member 290 in the peripheral region II. Also, the adhesive tape layer is formed on a lower surface of the TSP-FPC 190 in the peripheral region II. One or more of the PET layer, the PI layer, and the silicon rubber layer is formed on the lower surface of the adhesive tape layer.

The adhesive tape layer and one or more of the PET layer, the PI layer, and the silicon rubber layer can be sequentially formed on the TSP-FPC 190 based on the distance D2 between the TSP-FPC 190 and the first substrate 110. The bottom structure 240 is spaced apart from an upper surface of the first substrate 110 in the peripheral region II. To substantially prevent the first substrate 110 from being damaged near the pad unit due to external impacts, the distance between the bottom structure 240 and the first substrate 110 is relatively small.

Further, when the top structure 210 at is formed on the lower surface of the protecting member 290, the top structure 210 functions as a barrier. For example, when the top structure 210 is not formed at the lower surface of the protecting member 290, a resin, in a liquid state, can freely move from the display region I to the peripheral region II on the protecting member 290 while the resin layer 270 is cured by a laser. The resin moves along the protecting member 290 in the peripheral region II and then the resin can be cured on the peripheral region II of the protecting member 290. Thereafter, a discoloration phenomenon occurs in the peripheral region II of the protecting member 290. Thus, when the top structure 210 contacts the lower surface of the protecting member 290, the top structure 210 substantially blocks the movement of the resin. Accordingly, discoloration of the protecting member 290 can be prevented.

Figure 6:
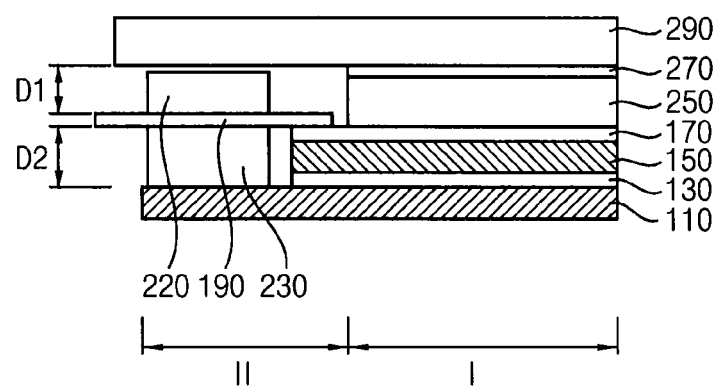
FIG. 6 is a cross-sectional view illustrating a display device according to yet another embodiment.

In yet another embodiment, as illustrated in FIG. 6, the top structure 220 is spaced apart from the lower surface of the protecting member 290 in the peripheral region II. In addition, the bottom structure 230 contacts an upper surface of the first substrate 110 in the peripheral region II. The top structure 220 maintains a distance between the TSP-FPC 190 and the protecting member 290. In addition, the bottom structure 230 maintains a distance between the TSP-FPC 190 and the first substrate 110.

In some embodiments, each of the top and bottom structures 220 and 230 include a buffer member, a supporting member, or a spacer. Each of the top and bottom structures 220 and 230 may include a stacked structure including a plurality of layers. Each of the layers may include the PET layer, the PI layer, or the silicon rubber layer. Here, the stacked structure may further include the adhesive tape layer between the layers. In some embodiments, the adhesive tape layer is formed on an upper surface of the TSP-FPC 190 in the peripheral region II. One or more of the PET layer, the PI layer, and the silicon rubber layer is formed on the adhesive tape layer.

The adhesive tape layer and one or more of the PET layer, the PI layer, and the silicon rubber layer can be sequentially formed on the TSP-FPC 190 based on the distance D1 between the TSP-FPC 190 and the protecting member 290. The top structure 220 is spaced apart from the lower surface of the protecting member 290 in the peripheral region II. To substantially prevent the first substrate 110 from being damaged near the pad unit due to external impacts, the distance between the top structure 220 and the protecting member 290 is relatively small. Also, the adhesive tape layer is formed on a lower surface of the TSP-FPC 190 in the peripheral region II. One or more of the PET layer, the PI layer, and the silicon rubber layer is formed on the lower surface of the adhesive tape layer. The adhesive tape layer and one or more of the PET layer, the PI layer, and the silicon rubber layer can be sequentially formed on the TSP-FPC 190 based on the distance D2 between the TSP-FPC 190 and the first substrate 110, To substantially prevent the first substrate 110 from being damage near the pad unit due to external impacts, the bottom structure 230 contacts an upper surface of the first substrate 110 in the peripheral region II.

As described above, since the display device 100 according to at least one embodiment includes the top and bottom structures 210, 220, 230, and 240, the display device 100 can substantially prevent the first substrate 110 from being damaged due to external impacts when the first substrate 110 is formed to have a thin profile. Accordingly, the thickness of the first substrate 110 can be reduced and thus the thickness of the display device 100 can also be reduced.

FIGS. 7A through 7G are cross-sectional views illustrating a method of manufacturing a display device in accordance with embodiments.

Figure 7A:
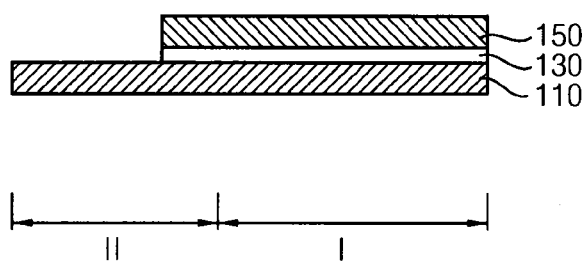
FIGS. 7A through 7G are cross-sectional views illustrating a method of manufacturing a display device according to an embodiment.

Referring to FIG. 7A, a first substrate 110 including a display region I and a peripheral region II is provided. The substrate 110 may include a glass substrate, a quartz substrate, a transparent resin substrate, etc. or a combination thereof.

To form the display device 100 with a thin profile, the first substrate 110 is formed to have a thin profile. Thus, the strength of the first substrate 110 is reduced and the first substrate 110 is more easily broken in a peripheral portion of the first substrate 110 (e.g., in the pad unit of the display device 100).

The light-emitting structure 130 is formed on the first substrate 110. The light-emitting structure 130 may include a switching element, an anode electrode, an emission layer, and a cathode electrode. The emission layer is formed on the first substrate 110. The emission layer generates light. The emission layer is formed between the cathode electrode and the anode electrode. The emission layer can include a hole injection layer (HIL), a hole transfer layer (HTL), an organic light-emitting layer (EL), an electron transfer layer (ETL), an electron injection layer (EIL), etc. In some embodiments, the organic light-emitting layer includes light-emitting materials which can generate different colors of light such as a red, green, and blue light in accordance with the types of pixels included in the OLED display 100.

In other embodiments, the organic light-emitting layer generates white light via a stack of a plurality of light-emitting materials that can generate different colors of light such as red, green, and blue light. The second substrate 150 is formed on the light-emitting structure 130. Here, the second substrate 150 is opposed to the first substrate 110. The second substrate 150 includes transparent inorganic materials or a flexible plastic. For example, the second substrate 150 may include a glass substrate, a quartz substrate, a transparent resin substrate, etc. or a combination thereof. In some embodiments, to increase the flexibility of the display device 100, the second substrate 150 includes at least one an organic layer and at least one an inorganic layer. The organic and inorganic layers can be alternately stacked to increase the flexibility of the display device 100. The first substrate 110 and light-emitting structure 130 of the display device 100 can be formed in accordance with standard manufacturing processes.

Figure 7B:
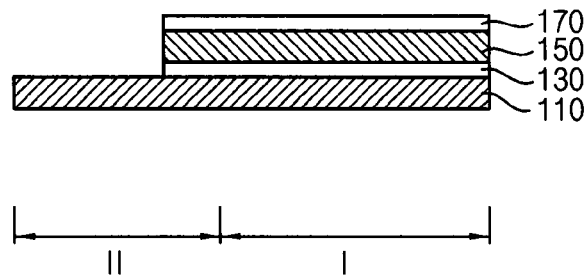

Referring FIG. 7B, a touch screen panel 170 is formed on the second substrate 150. The touch screen panel 170 includes a bottom PET film, touch screen panel electrodes, a top PET film, etc. The bottom PET film and the top PET film protect the touch screen panel electrodes. For example, the bottom PET film and the top PET film may include the PET, the PEN, the PP, the PC, the PS, the PSul, the PE, the PPA, the PES, the PAR, the PCO, the MPPO, etc. or a combination thereof. In some embodiments, the thickness of the bottom PET is about 80 μm and the thickness of the top PET is in the range of about 40 μm to about 60 μm. However, according to other embodiments, the bottom PET can have a thickness of less than or greater than about 80 μm and the top PET can have a thickness less than about 40 μm or greater than about 60 μm. The touch screen panel electrodes may have a metal mesh structure. For example, the touch screen panel electrodes may include the CNT, the TCO, the ITO, the IGZO, the ZnO, the graphene, the AgNW, the Cu, the Cr, etc. or a combination thereof. The touch screen panel 170 of the display device 100 can be formed by standard manufacturing processes.

Figure 7C:
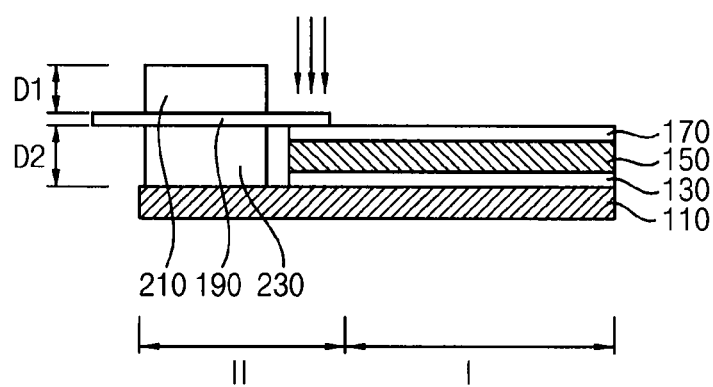

Referring to FIG. 7C, a TSP-FPC 190 having a top structure 210 and a bottom structure 230 is electrically connected to the peripheral region II of the touch screen panel 170. In some embodiments, the TSP-FPC 190 is formed before the top structure 210 on an upper surface of the TSP-FPC 190 in the peripheral region II. In addition, the bottom structure 230 is formed on a lower surface of the TSP-FPC 190 in the peripheral region II. In other embodiments, after each of the top and bottom structures 210 and 230 is formed in the peripheral region II, the TSP-FPC 190 is formed in the peripheral region II. The TSP-FPC 190 may be electrically connected to the touch screen panel 170 by a conductive tape. Here, tape automated bonding TAB, or the like can be used to electrically connect the TSP-FPC 190 to the touch screen panel 170.

In some embodiments, the top structure 210 contacts the lower surface of the protecting member 290 in the peripheral region II. In addition, the bottom structure 230 contacts upper surface of the first substrate 110 in the peripheral region II. The top structure 210 maintains a distance between the TSP-FPC 190 and the protecting member 290. In addition, the bottom structure 230 maintains a distance between the TSP-FPC 190 and the first substrate 110.

For example, each of the top and bottom structures 210 and 230 can include a buffer member, a supporting member, or a spacer. Each of the top and bottom structures 210 and 230 may include a stacked structure having a plurality of layers. Each of the layers may include a PET layer, a PI layer, or a silicon rubber layer. Here, the stacked structure may further include an adhesive tape layer between the layers. For example, the adhesive tape layer can be formed on an upper surface of the TSP-FPC 190 in the peripheral region II. One or more of the PET layer, the PI layer, and the silicon rubber layer may be formed on the adhesive tape layer.

The adhesive tape layer and one or more of the PET layer, the PI layer, and the silicon rubber layer can be sequentially formed on the TSP-FPC 190 based on the distance D1 between the TSP-FPC 190 and the protecting member 290. To substantially prevent the first substrate 110 from being broken near the pad unit due to external impacts, the top structure 210 contacts the lower surface of the protecting member 290 in the peripheral region II. Also, the adhesive tape layer may be formed on a lower surface of the TSP-FPC 190 in the peripheral region II. One or more of the PET layer, the PI layer, and the silicon rubber layer may be formed on a lower surface of the adhesive tape layer.

The adhesive tape layer and one or more of the PET layer, the PI layer, and the silicon rubber layer can be sequentially formed on the TSP-FPC 190 based on the distance D2 between the TSP-FPC 190 and the first substrate 110. To substantially prevent the first substrate 110 from being broken near the pad unit due to external impacts, the bottom structure 230 contacts the upper surface of the first substrate 110 in the peripheral region II. Further, when the top structure 210 contacts the lower surface of the protecting member 290, the top structure 210 can function as a barrier. For example, when the top structure 210 is not formed at the lower surface of the protecting member 290, a resin, in a liquid state, can freely move from the display region I to the peripheral region II on the protecting member 290 while the resin layer 270 is cured by a laser. The resin moves along the protecting member 290 at the peripheral region II and then the resin can be cured on the peripheral region II of the protecting member 290. Therefore, discoloration occurs in the peripheral region II of the protecting member 290. Thus, when the top structure 210 is formed on the lower surface of the protecting member 290, the top structure 210 substantially blocks the movement of the resin. In addition, discoloration of the protecting member 290 can be prevented.

Figure 7D:
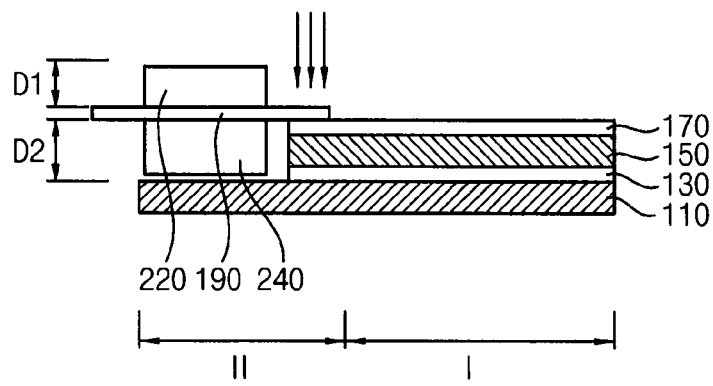

In another embodiment, as illustrated in FIG. 7D, the TSP-FPC 190 having a top structure 220 and a bottom structure 240 is electrically connected to the peripheral region II of the touch screen panel 170. In some embodiments, the TSP-FPC 190 is provided before forming the top structure 220 on the upper surface of the TSP-FPC 190 in the peripheral region II. In addition, the bottom structure 240 is formed on the lower surface of the TSP-FPC 190 in the peripheral region II. In other embodiments, after each of the top and bottom structures 220 and 240 is formed in the peripheral region II, the TSP-FPC 190 is formed in the peripheral region II. The TSP-FPC 190 may be electrically connected to the touch screen panel 170 by a conductive tape. Here, TAB, or the like can be used to electrically connect the TSP-FPC 190 to the touch screen panel 160.

In the FIG. 7D embodiment, the top structure 220 is spaced apart from the lower surface of the protecting member 290 in the peripheral region II. In addition, the bottom structure 240 is spaced apart from the upper surface of the first substrate 110 in the peripheral region II. The top structure 220 maintains a distance between the TSP-FPC 190 and the protecting member 290. In addition, the bottom structure 230 maintains a distance between the TSP-FPC 190 and the first substrate 110.

For example, each of the top and bottom structures 220 and 240 may include the buffer member, the supporting member, or the spacer. Each of the top and bottom structures 220 and 240 may include a stacked structure having a plurality of layers. Each of the layers may include the PET layer, the PI layer, or the silicon rubber layer. Here, the stacked structure may further include the adhesive tape layer between the layers. For example, the adhesive tape layer can be formed on an upper surface of the TSP-FPC 190 in the peripheral region II. One or more of the PET layer, the PI layer, and the silicon rubber layer may be formed on the adhesive tape layer.

The adhesive tape layer and one or more of the PET layer, the PI layer, and the silicon rubber layer can be sequentially formed on the TSP-FPC 190 based on the distance D1 between the TSP-FPC 190 and the protecting member 290. The top structure 220 is spaced apart from a lower surface of the protecting member 290 in the peripheral region II. To substantially prevent the first substrate 110 from being damaged in the pad unit due to external impacts, the distance between the top structure 220 and the protecting member 290 is relatively small. Also, the adhesive tape layer is formed on the lower surface of the TSP-FPC 190 in the peripheral region II. One or more of the PET layer, the PI layer, and the silicon rubber layer may be formed on the lower surface of the adhesive tape layer.

The adhesive tape layer and one or more of the PET layer, the PI layer, and the silicon rubber layer can be sequentially formed on the TSP-FPC 190 based on the distance D2 between the TSP-FPC 190 and the first substrate 110. The bottom structure 240 is spaced apart from the upper surface of the first substrate 110 in the peripheral region II. To substantially prevent the first substrate 110 from being damaged near the pad unit due to external impacts, the distance between the bottom structure 240 and the first substrate 110 is relatively small.

Figure 7E:
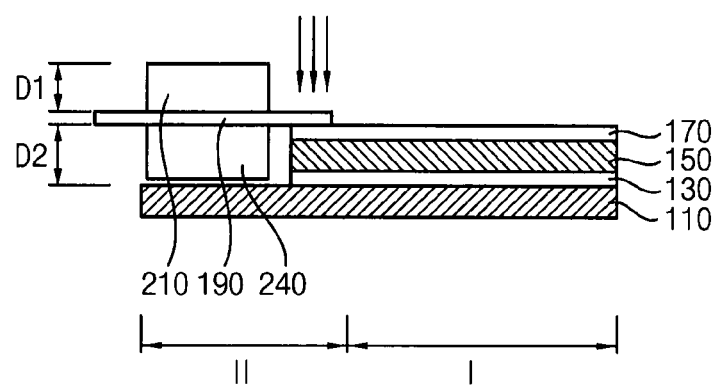

In still another embodiment, as illustrated in FIG. 7E, the TSP-FPC 190 having a top structure 210 and a bottom structure 240 is electrically connected to the peripheral region II of the touch screen panel 170. In some embodiments, the TSP-FPC 190 is provided before forming the top structure 210 on an upper surface of the TSP-FPC 190 in the peripheral region II. In addition, the bottom structure 240 is formed on the lower surface of the TSP-FPC 190 in the peripheral region II. In other embodiments, after each of the top and bottom structures 210 and 240 are formed at the peripheral region II, the TSP-FPC 190 is formed the peripheral region II. The TSP-FPC 190 may be electrically connected to the touch screen panel 170 by a conductive tape. Here, TAB, or the like can be used to electrically connect the TSP-FPC 190 to the touch screen panel 170.

In the FIG. 7E embodiment, the top structure 210 contacts the lower surface of the protecting member 290 in the peripheral region II. In addition, the bottom structure 240 is spaced apart from the upper surface of the first substrate 110 in the peripheral region II. The top structure 210 maintains a distance between the TSP-FPC 190 and the protecting member 290. In addition, the bottom structure 240 maintains a distance between the TSP-FPC 190 and the first substrate 110. Each of the top and bottom structures 210 and 240 may include the buffer member, the supporting member, or the spacer. Each of the top and bottom structures 210 and 240 may include a stacked structure having a plurality of layers. Each of the layers may include the PET layer, the PI layer, or the silicon rubber layer. Here, the stacked structure may further include the adhesive tape layer between the layers. In some embodiments, the adhesive tape layer is formed on an upper surface of the TSP-FPC 190 in the peripheral region II. One or more of the PET layer, the PI layer, and the silicon rubber layer is formed on the adhesive tape layer.

The adhesive tape layer and one or more of the PET layer, the PI layer, and the silicon rubber layer can be sequentially formed on the TSP-FPC 190 based on the distance D1 between the TSP-FPC 190 and the protecting member 290. To substantially prevent the first substrate 110 from being damaged near the pad unit due to external impacts, the top structure 210 contacts the lower surface of the protecting member 290 in the peripheral region II. Also, the adhesive tape layer is formed on the lower surface of the TSP-FPC 190 in the peripheral region II. One or more of the PET layer, the PI layer, and the silicon rubber layer may be formed on a lower surface of the adhesive tape layer.

The adhesive tape layer and one or more of the PET layer, the PI layer, and the silicon rubber layer can be sequentially formed on the TSP-FPC 190 based on the distance D2 between the TSP-FPC 190 and the first substrate 110. The bottom structure 240 is spaced apart from the upper surface of the first substrate 110 in the peripheral region II. To substantially prevent the first substrate 110 from being damaged the pad unit due to external impacts, the distance between the bottom structure 240 and the first substrate 110 is relatively small.

Further, when the top structure 210 is formed at the lower surface of the protecting member 290, the top structure 210 functions as a barrier. For example, when the top structure 210 is not formed at the lower surface of the protecting member 290, a resin, in a liquid state, freely moves from the display region I to the peripheral region II on the protecting member 290 while the resin layer 270 is cured by a laser. The resin moves along the protecting member 290 in the peripheral region II and then the resin can be cured in the peripheral region II of the protecting member 290. Thereafter, a discoloration phenomenon can occur in the peripheral region II of the protecting member 290. Thus, when the top structure 210 is formed on the lower surface of the protecting member 290, the top structure 210 substantially blocks the movement of the resin. In addition, discoloration of the protecting member 290 can be prevented.

Figure 7F:
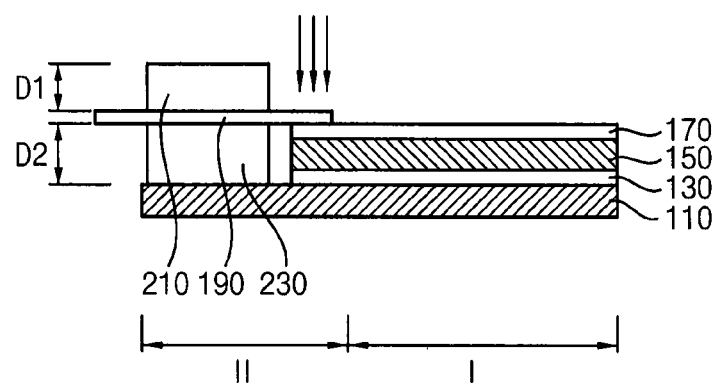

In yet still another embodiment, as illustrated in FIG. 7F, the TSP-FPC 190 having a top structure 220 and a bottom structure 230 is electrically connected to the peripheral region II of the touch screen panel 170. In some embodiments, the TSP-FPC 190 is provided before forming the top structure 220 on the upper surface of the TSP-FPC 190 in the peripheral region II. In addition, the bottom structure 230 is formed on the lower surface of the TSP-FPC 190 in the peripheral region II. In other embodiments, after each of the top and bottom structures 220 and 230 are formed in the peripheral region II, the TSP-FPC 190 is formed in the peripheral region II. The TSP-FPC 190 may be electrically connected to the touch screen panel 170 by a conductive tape. Here, TAB, or the like can be used to electrically connect the TSP-FPC 190 to the touch screen panel 170.

In the FIG. 7F embodiment, the top structure 220 is spaced apart from the lower surface of the protecting member 290 in the peripheral region II. In addition, the bottom structure 230 contacts the upper surface of the first substrate 110 in the peripheral region II. The top structure 220 maintains a distance between the TSP-FPC 190 and the protecting member 290. In addition, the bottom structure 230 maintains a distance between the TSP-FPC 190 and the first substrate 110.

For example, each of the top and bottom structures 220 and 230 can include a buffer member, a supporting member, or a spacer. Each of the top and bottom structures 220 and 230 may include a stacked structure having a plurality of layers. Each of the layers may include the PET layer, the PI layer, or the silicon rubber layer. Here, the stacked structure may further include the adhesive tape layer between the layers. In some embodiments, the adhesive tape layer is formed on an upper surface of the TSP-FPC 190 in the peripheral region II. One or more of the PET layer, the PI layer, and the silicon rubber layer is formed on the adhesive tape layer.

The adhesive tape layer and one or more of the PET layer, the PI layer, and the silicon rubber layer can be sequentially formed on the TSP-FPC 190 based on the distance D1 between the TSP-FPC 190 and the protecting member 290. The top structure 220 is spaced apart from the lower surface of the protecting member 290 in the peripheral region II. To substantially prevent the first substrate 110 from being damaged near the pad unit due to external impacts, the distance between the top structure 220 and the protecting member 290 is relatively small. Also, the adhesive tape layer is formed on the lower surface of the TSP-FPC 190 in the peripheral region II. One or more of the PET layer, the PI layer, and the silicon rubber layer may be formed on a lower surface of the adhesive tape layer.

The adhesive tape layer and one or more of the PET layer, the PI layer, and the silicon rubber layer can be sequentially formed on the TSP-FPC 190 based on the distance D2 between the TSP-FPC 190 and the first substrate 110. To substantially prevent the first substrate 110 from being damaged near the pad unit due to external impacts, the bottom structure 230 contacts the upper surface of the first substrate 110 in the peripheral region II.

Figure 7G:
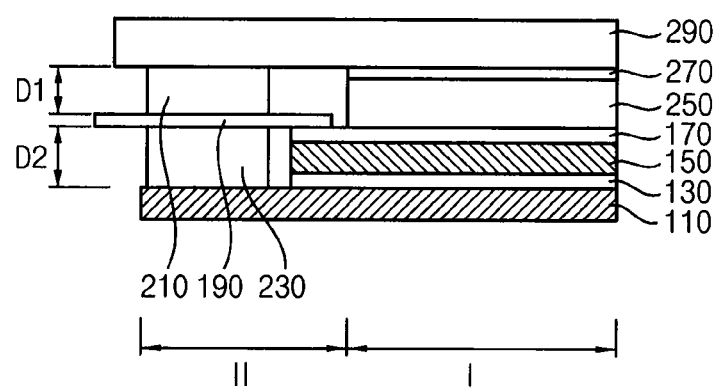

Referring to FIG. 7G, a polarizer 250 is formed on the touch screen panel 170 in the display region I. For example, the polarizer 250 may include a resin film such as polyvinyl-alcohol PVA, etc. In some embodiments, the thickness of the polarizer 250 is about 153 μm. However, according to other embodiments, the thickness of the polarizer is less than or greater than about 153 μm. The polarizer 250 substantially blocks external light incident on the display device 100 from the environment from being reflected. The polarizer 250 includes a linearly polarized layer and a λ/4 phase retardation layer. One embodiment of the structure of the polarizer 250 includes the linearly polarized layer formed on the λ/4 phase retardation layer.

The resin layer 270 is formed on the polarizer 250. A protecting member 290 and the polarizer 250 are bonded by the resin layer 270. For example, the resin layer 270 may include a photopolymer resin containing oligomer, urethane acrylate, monomer, photoinitiator, solvent, ketone, etc. or a combination thereof. The photopolymer resin has a high transmittance and an adhesive property. The protecting member 290 is formed on the resin layer 270. The protecting member 290 covers the display region I and the peripheral region II. In some embodiments, the protecting member 290 includes a plastic window. For example, the plastic window may include a plastic-based material having transparency of greater than about 95%. However, according to embodiments, the transparency of the plastic-based material can be less than about 95%. The polarizer 250, the resin layer 270, and the protecting member 290 can be formed by using standard manufacturing processes.

As described above, since the display device according to at least one embodiment includes the top and bottom structures 210, 220, 230, and 240, the display device can substantially prevent the first substrate 110 from being damaged due to external impacts. Accordingly, the first substrate 110 can be formed with a thin profile, reducing the thickness of the display device.

FIGS. 8A through 8F are cross-sectional views illustrating a method of manufacturing a display device in accordance with some example embodiments.

Figure 8A:
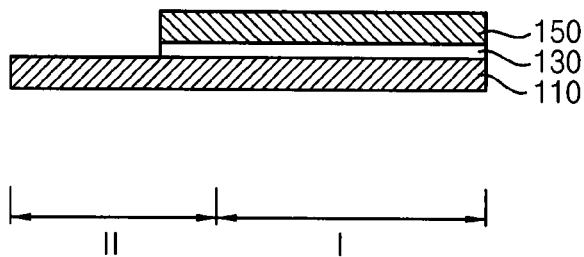
FIGS. 8A through 8F are cross-sectional views illustrating a method of manufacturing a display device according to another embodiment.

Referring to FIG. 8A, a first substrate 110 including a display region I and a peripheral region II is provided. For example, the substrate 110 may include a glass substrate, a quartz substrate, a transparent resin substrate, etc. or a combination thereof.

The first substrate 110 is formed with a thin profile to reduce the overall thickness of the display device 100. Thus, the strength of the first substrate 110 is compromised and the first substrate 110 can be more easily broken in a peripheral portion of the first substrate 110 (e.g., in a pad unit of the display device 100). The light-emitting structure 130 is formed on the first substrate 110. The light-emitting structure 130 includes a switching element, an anode electrode, an emission layer, and a cathode electrode. The emission layer is formed on the first substrate 110. The emission layer generates light. The emission layer is formed between the cathode electrode and the anode electrode.

The emission layer may include a hole injection layer (HIL), a hole transfer layer (HTL), an organic light-emitting layer (EL), an electron transfer layer (ETL), an electron injection layer (EIL), etc. In some embodiments, the organic light-emitting layer includes light-emitting materials which can generate different colors of light such as red, green, and blue light in accordance with the types of pixels included in the OLED display 100. In some embodiments, the organic light-emitting layer generate white light via a stack of a plurality of light-emitting materials which can generate different colors of light such as red, green, and blue light.

The second substrate 150 is formed on the light-emitting structure 130. Here, the second substrate 150 opposes the first substrate 110. The second substrate 150 may include transparent inorganic materials or a flexible plastic. For example, the second substrate 150 may include a glass substrate, a quartz substrate, a transparent resin substrate, etc. or a combination thereof. In some embodiments, to increase the flexibility of the display device 100, the second substrate 150 includes at least one an organic layer and at least one an inorganic layer. The organic and inorganic layers may be alternately stacked to increase the flexibility of the display device 100. The first substrate 110, the light-emitting structure 130, and light-emitting structure 130 of the display device 100 can be manufactured in accordance with standard manufacturing processes.

Figure 8B:
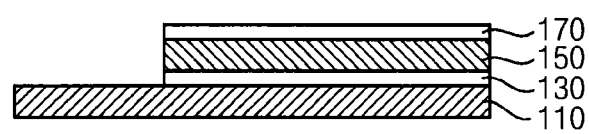

Referring FIG. 8B, a touch screen panel 170 is formed on the second substrate 150. The touch screen panel 170 may include a bottom PET film, touch screen panel electrodes, a top PET film, etc. The bottom PET film and the top PET film protect the touch screen panel electrodes. For example, the bottom PET film and the top PET film may include the PET, the PEN, the PP, the PC, the PS, the PSul, the PE, the PPA, the PES, the PAR, the PCO, the MPPO, etc. or a combination thereof. In some embodiments, the thickness of the bottom PET is about 80 µm and the thickness of the top PET is about 40 µm to about 60 µm. However, according to other embodiments, the thickness of the bottom PET is less than or greater than about 80 µm and the thickness of the top PET is less than about 40 µm or greater than about 60 µm. The touch screen panel electrodes may have a metal mesh structure. For example, the touch screen panel electrodes may include the CNT, the TCO, the ITO, the IGZO, the ZnO, the graphene, the AgNW, the Cu, the Cr, etc. or a combination thereof. The touch screen panel 170 of the display device 100 can be formed by standard manufacturing processes.

Figure 8C:
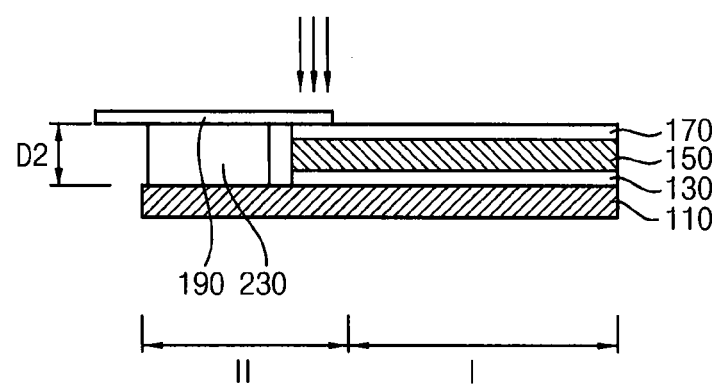

Referring to FIG. 8C, a TSP-FPC 190 having a bottom structure 230 is electrically connected to the peripheral region II of the touch screen panel 170. In some embodiments, the TSP-FPC 190 is provided before forming the bottom structure 230 on the lower surface of the TSP-FPC 190 in the peripheral region II. In other embodiments, after the bottom structure 230 is formed in the peripheral region II, the TSP-FPC 190 is formed in the peripheral region II. The TSP-FPC 190 may be electrically connected to the touch screen panel 170 by a conductive tape. Here, TAB, or the like be used to electrically connect the TSP-FPC 190 to the touch screen panel 170.

In one embodiment, the bottom structure 230 contacts the upper surface of the first substrate 110 in the peripheral region II. The bottom structure 230 maintains a distance between the TSP-FPC 190 and the first substrate 110. For example, the bottom structure 230 may include a buffer member, a supporting member, or a spacer. The bottom structure 230 may include a stacked structure having a plurality of layers. Each of the layers may include a PET layer, a PI layer, or a silicon rubber layer. Here, the stacked structure may further include an adhesive tape layer between the layers. For example, the adhesive tape layer may be formed on the lower surface of the TSP-FPC 190 in the peripheral region II. One or more of the PET layer, the PI layer, and the silicon rubber layer may be formed on the lower surface of the adhesive tape layer. The adhesive tape layer and one or more of the PET layer, the PI layer, and the silicon rubber layer can be sequentially formed on the TSP-FPC 190 based on the distance D2 between the TSP-FPC 190 and the first substrate 110. To substantially prevent the first substrate 110 from being damaged near the pad unit due to external impacts, the bottom structure 230 contacts an upper surface of the first substrate 110 in the peripheral region II.

Figure 8D:

Referring to FIG. 8D, a protecting member 290 is provided. The protecting member 290 covers the display region I and the peripheral region II. The resin layer 270 is formed on a lower surface of the protecting member 290. The protecting member 290 and a polarizer 250 are bonded by the resin layer 270. For example, the resin layer 270 may include a photopolymer resin containing oligomer, urethane acrylate, monomer, photoinitiator, solvent, ketone, etc. or a combination thereof. The photopolymer resin has a high transmittance and an adhesive property. The protecting member 290 is formed on the resin layer 270. In some embodiments, the protecting member 290 includes a plastic window. For example, the plastic window may include a plastic-based material having transparency of greater than about 95%. The polarizer 250 is formed on a lower surface of the resin layer 270. For example, the polarizer 250 may include a resin film such as polyvinyl-alcohol PVA, etc. In some embodiments, the thickness of the polarizer 250 is about 153 µm. However, according to other embodiments, the thickness of the polarizer can be less than or greater than about 153 µm. In some embodiments, the polarizer 250 substantially blocks external light incident from the environment from being reflected. The polarizer 250 includes a linearly polarized layer and a λ/4 phase retardation layer. One embodiment of the structure of the polarizer 250 includes the linearly polarized layer formed on the λ/4 phase retardation layer. The polarizer 250, the resin layer 270, and the protecting member 290 can be formed by standard manufacturing processes.

Figure 8E:
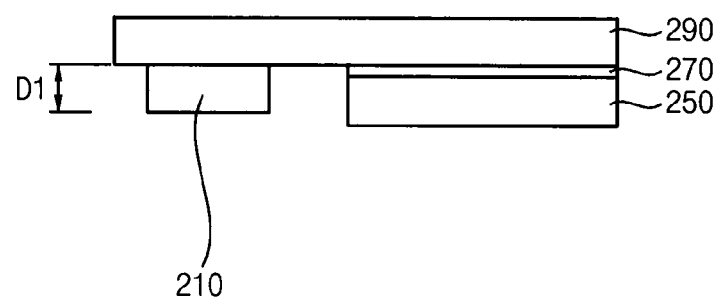

Referring FIG. 8E, the top structure 210 is formed on the lower surface of the protecting member 290 in the peripheral region II.

The top structure 210 contacts the upper surface of the TSP-FPC 190 in the peripheral region II. The top structure 210 maintains a distance between the TSP-FPC 190 and the protecting member 290. For example, the top structure 210 may include a buffer member, a supporting member, or a spacer. The top structure 210 may include a stacked structure having a plurality of layers. Each of the layers may include a PET layer, a PI layer, or a silicon rubber layer. Here, the stacked structure may further include an adhesive tape layer between the layers. In some embodiments, the adhesive tape layer is formed on the upper surface of the TSP-FPC 190 in the peripheral region II. One or more of the PET layer, the PI layer, and the silicon rubber layer may be formed on the adhesive tape layer.

The adhesive tape layer and one or more of the PET layer, the PI layer, and the silicon rubber layer can be sequentially formed on the TSP-FPC 190 based on the distance D1 between the TSP-FPC 190 and the protecting member 290. To substantially prevent the first substrate 110 from being damaged near the pad unit due to external impacts, the top structure 210 contacts the upper surface of the TSP-FPC 190 in the peripheral region II. Further, when the top structure 210 is formed at the lower surface of the protecting member 290, the top structure 210 functions as a barrier. For example, when the top structure 210 is not formed at the lower surface of the protecting member 290, a resin, in a liquid state, freely moves from the display region I to the peripheral region II on the protecting member 290 while the resin layer 270 is cured by a laser. The resin moves along the protecting member 290 in the peripheral region II and then the resin is cured on the peripheral region II of the protecting member 290. Thereafter, a discoloration phenomenon may occur in the peripheral region II of the protecting member 290. Thus, when the top structure 210 is formed on the lower surface of the protecting member 290, the top structure 210 substantially blocks the movement of the resin. In addition, discoloration of the protecting member 290 can be prevented.

Figure 8F:
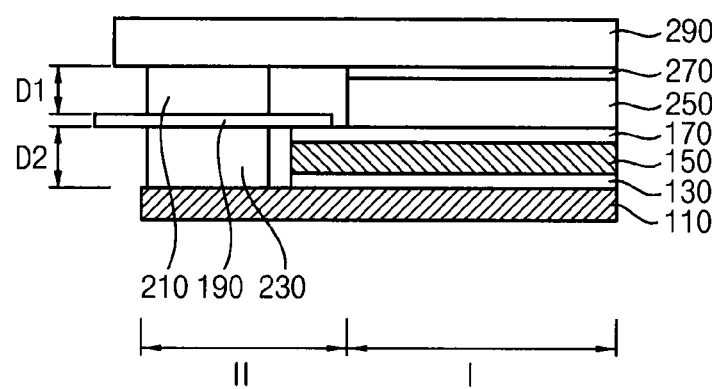

Referring to FIG. 8f, the protecting member 290 on which the top structure 210, the resin layer 270, and the polarizer 250 are formed is attached to the touch screen panel 170

As described above, since the display device according to at least one embodiment includes the top and bottom structures 210 and 230, the display device substantially prevents the first substrate 110 from being damaged due to external impacts. Accordingly, the thickness of the first substrate 110 can be reduced, and thus the thickness of the display device can also be reduced.

The described technology may be applied to any electronic device including a touch screen panel and a display device. For example, the described technology can be applied to a television, a mobile phone, a smart phone, a laptop, a tablet, a computer, a personal digital assistant (PDA), a portable multimedia player (PMP), a digital camera, a music player (e.g., MP3 player), a portable game console, a navigation system, etc.

The foregoing is illustrative of embodiments and is not to be construed as limiting thereof. Although a few example embodiments have been described, those skilled in the art will readily appreciate that many modifications are possible to the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device, comprising:
   a first substrate including a display region and a peripheral region;
   a light-emitting structure formed over the first substrate;
   a second substrate formed over the light-emitting structure;
   a touch screen panel formed over the second substrate;
   a touch screen panel-flexible printed circuit (TSP-FPC) board at least partially overlapping the peripheral region, wherein the TSP-FPC board is electrically connected to the touch screen panel;
   a polarizer formed over the touch screen panel in the display region;
   a resin layer formed over the polarizer;
   a protective member formed over the resin layer, wherein the protective member substantially covers the display region and the peripheral region;
   a top structure interposed between the TSP-FPC board and the protective member in the peripheral region; and
   a bottom structure interposed between the TSP-FPC board and the first substrate in the peripheral region.

2. The device of claim 1, wherein each of the top structure and the bottom structure comprises a buffer member, a supporting member, or a spacer.

3. The device of claim 1, wherein the top structure is configured to maintain the TSP-FPC board at a predetermined distance from the protective member.

4. The device of claim 1, wherein the top structure is formed on an upper surface of the TSP-FPC board and contacts a lower surface of the protective member.

5. The device of claim 1, wherein the top structure is formed on an upper surface of the TSP-FPC board and is spaced apart from a lower surface of the protective member.

6. The device of claim 1, wherein the bottom structure is configured to maintain the TSP-FPC board at a predetermined distance from the first substrate.

7. The device of claim 1, wherein the bottom structure is formed on a lower surface of the TSP-FPC board and contacts an upper surface of the first substrate.

8. The device of claim 1, wherein the bottom structure is formed on a lower surface of the TSP-FPC board and is spaced apart from an upper surface of the first substrate.

9. The device of claim 1, wherein at least one of the top structure and the bottom structure comprises a plurality of layers.

10. The device of claim 9, wherein each of the layers is a polyethylene terephthalate (PET) layer, a polyimide (PI) layer, or a silicon rubber layer.

11. The device of claim 9, wherein the at least one of the top structure and the bottom structure further comprises an adhesive tape interposed between the layers.

12. A method of manufacturing a display device, comprising:
   providing a first substrate including a display region and a peripheral region;
   forming a light-emitting structure over the first substrate;
   forming a second substrate over the light-emitting structure;
   forming a touch screen panel over the second substrate;
   providing a touch screen panel-flexible printed circuit (TSP-FPC) board;
   forming a top structure on an upper surface of the TSP-FPC board;
   forming a bottom structure on a lower surface of the TSP-FPC board;
   attaching the TSP-FPC board to the first substrate such that the top and bottom structures are located in the peripheral region;
   electrically connecting the TSP-FPC board to the touch screen panel;
   forming a polarizer over the touch screen panel in the display region;
   forming a resin layer over the polarizer; and
   forming a protective member over the resin layer, wherein the protective member substantially covers the display region and the peripheral region.

13. The method of claim 12, wherein each of the top structure and bottom structure comprises a buffer member, a supporting member, or a spacer;

wherein the top structure is configured to maintain the TSP-FPC board at a predetermined distance from the protective member; and wherein the bottom structure is configured to maintain the TSP-FPC board at a predetermined distance from the first substrate.

14. The method of claim 12, wherein the forming of at least one of the top structure and the bottom structure comprises forming a plurality of layers and wherein each of the layers is a polyethylene terephthalate layer, a polyimide layer, or a silicon rubber layer.

15. The method of claim 14, wherein the forming of the layers further comprises forming an adhesive material between the layers.

16. A display device, comprising:
- a first substrate including a display area and a peripheral area;
- a light-emitting structure formed over the first substrate in the display area;
- a touch screen panel formed over the light-emitting structure;
- a second substrate formed over the touch screen panel and substantially covering the display area and the peripheral area;
- a touch screen panel-flexible printed circuit (TSP-FPC) board electrically connected to the touch screen panel;
- a first spacer formed in the peripheral area and interposed between the TSP-FPC board and the first substrate; and
- a second spacer formed in the peripheral area and interposed between the TSP-FPC board and the second substrate.

17. The display device of claim 16, wherein the first spacer is configured to maintain a first distance between the TSP-FPC board and the first substrate and wherein the second spacer is configured to maintain a second distance between the TSP-FPC board and the second substrate.

18. The display device of claim 17, wherein the second distance is greater than the first distance.

19. The display device of claim 16, wherein the second spacer is formed on an upper surface of the TSP-FPC board and is spaced apart from a lower surface of the second substrate.

20. The display device of claim 16, wherein the first spacer is formed on a lower surface of the TSP-FPC board and is spaced apart from an upper surface of the first substrate.

* * * * *